United States Patent [19]

Guckel et al.

[11] Patent Number: 4,897,360
[45] Date of Patent: Jan. 30, 1990

[54] POLYSILICON THIN FILM PROCESS

[75] Inventors: Henry Guckel; David W. Burns, both of Madison, Wis.

[73] Assignee: Wisconsin Alumni Research Foundation, Madison, Wis.

[21] Appl. No.: 131,082

[22] Filed: Dec. 9, 1987

[51] Int. Cl.$^4$ .................. H01L 21/00; H01L 21/20
[52] U.S. Cl. .................. 437/7; 148/DIG. 25; 148/DIG. 97; 148/DIG. 122; 357/26; 357/59; 437/60; 437/101; 437/109; 437/233; 437/247; 437/901; 437/914; 437/974
[58] Field of Search .............. 148/DIG. 1, 3, 17, 25, 148/97, 122, 169, 33, 33.1, 33.2; 156/628, 647, 653; 357/26, 55, 59; 437/7, 60, 80, 109, 81, 109, 82, 174, 233, 247, 901, 914, 974

[56] References Cited

U.S. PATENT DOCUMENTS

| | | | |
|---|---|---|---|
| 3,900,597 | 8/1975 | Chruma et al. | 118/49 |
| 3,938,175 | 2/1976 | Jaffe et al. | 437/901 |
| 4,203,138 | 5/1980 | Guckel et al. | 357/60 |
| 4,228,452 | 10/1980 | Losee et al. | 357/59 |
| 4,234,361 | 11/1980 | Guckel et al. | 357/60 |
| 4,240,196 | 12/1980 | Jacobs et al. | 156/653 |
| 4,371,890 | 2/1983 | Anagnostopoulos et al. | 357/59 |
| 4,588,472 | 5/1986 | Shimizu | 156/628 |
| 4,592,238 | 6/1986 | Busta | 73/727 |
| 4,672,354 | 6/1987 | Kurtz et al. | 338/4 |
| 4,744,863 | 5/1988 | Guckel et al. | 156/653 |

OTHER PUBLICATIONS

Beers et al., "CVD Silicon Structures Formed by Amorphous and Crystalline Growth", J. Crys. Growth, 64 (1983), pp. 563–571.
Kamins, "Structure and Properties of LPCVD Silicon Films", J. Electrochem. Soc., vol. 127, No. 3, Mar. 1980, pp. 686–690.
Kurokawa, "P-Doped Polysilicon Film Growth Technology", J. Electrochem. Soc., vol. 129, No. 11, Nov. 1982, pp. 2620–2623.
Manduroh et al., "Phosphorus . . . of Low Pressure Chemically Vapor-Deposited Silicon Films", J. Electrochem. Soc., vol. 126, No. 6, Jun. 1979, pp. 1019–1023.
Baudrart et al., "The LPCVD Polysilicon . . . " J. Electrochem. Soc., vol. 129, No. 5, May 1982, pp. 1109–1116.

(List continued on next page.)

Primary Examiner—Brian E. Hearn
Assistant Examiner—William Bunch
Attorney, Agent, or Firm—Lathrop & Clark

[57] ABSTRACT

Polycrystalline silicon is deposited in a film onto the surface of a substrate which has been carefully prepared to eliminate any defects or contaminants which could nucleate crystal growth on the substrate. The deposition is carried out by low pressure decomposition of silane at substantially 580° C. to cause a film of fine grained crystals of polysilicon to be formed having grain sizes averaging less than about 300 Angstroms after annealing. Such a film is very uniform and smooth, having a surface roughness less than about 100 Angstroms RMS. Annealing of the film and substrate at a low temperature results in a compressive strain in the field that decreases over the annealing time, annealing at high temperatures (e.g., over 1050° C.) yields substantially zero strain in the film, and annealing at intermediate temperatures (e.g., 650° C. to 950° C.) yields tensile strain at varying strain levels depending on the annealing temperature and time. Further processing of the polysilicon films and the substrate can yield isolated diaphragms of the polysilicon film which are supported only at edges by the substrate and which have substantial lateral dimensions, e.g., 1 cm by 1 cm. Such that structures can be used as pressure sensor diaphragms, X-ray masks, and optical filters, and can be provided with holes of varying sizes, shape and number, which can serve as X-ray mask patterns. The diaphragms can be provided with numerous holes of uniform size and spacing which allows the diaphragms to be used as filters in ultrafiltration applications.

16 Claims, 11 Drawing Sheets

OTHER PUBLICATIONS

Meyersen et al., "Phosphorus-Doped Polycrystalline Silicon via LPCVD", J. Electrochem. Soc., vol. 131, No. 10, Oct. 1984, pp. 2366-2368.

Duffy et al., "LPCVD Polycrystalline Silicon: . . . ", RCA Review, vol. 44, Jun. 1983, pp. 313-325.

Horbeke et al., "LPCVD Polycrystalline Silicon . . . ", RCA Review, vol. 44, Jun. 1983, pp. 287-312.

Published Patent Cooperation Treaty Application PCT/US86/00860, Publication No. WO86/06548, International Publication Date Nov. 6, 1986, for Sealed Cavity Semiconductor Pressure Transducers and Method.

R. T. Howe, Ph.D., Disseration entitled, "Integrated Silicon Electromechanical Vapor Sensor," University of California, dated May 30, 1984.

T. I. Kamins et al., "Structure and Stability of Low Pressure Chemically Vapor-Deposited Silicon Films," J. Electrochem. Soc., Solid-State Science Technology, Jun. 1978, pp. 927-932.

M. Sekimoto et al., "Silicon Nitride Single-Layer X-Ray Mask," J. Vac. Sci. Technol., vol. 21, No. 4, Nov./Dec. 1982, pp. 1017-1021.

R. T. Howe et al., "Stress in Polycrystalline and Amorphous Silicon Thin Films", J. Appl. Phys., vol. 54, No. 8, Aug. 1983, pp. 4674-4675.

E. I. Bromley et al., "A Technique for the Determination of Stress in Thin Films," J. Vac. Sci. Technol. B1(4), Oct.-Dec. 1983, pp. 1364-1366.

G. Harbecke et al., "Growth and Physical Properties of LPCVD Polycrystalline Silicon," J. Electrochem. Soc.: Solid-State Science and Technology, vol. 131, No. 3, Mar. 1984, pp. 675-682.

H. Guckel et al., "Planar Processed Polysilicon Sealed Cavities for Pressure Transducer Arrays," Proceedings of IEEE International Electronc Devices Meeting, pp. 223-225, San Francisco, Cal., Dec. 1984.

H. Guckel et al., "A Technology for Integrated Transducers," Proceedings of the International Conference on Sensors and Actuators-Transducers '85, pp. 90-92, Philadelphia, Pennsylvania, Jun. 1985.

H. Guckel et al., "Laser-Recrystallized Piezoresistive Micro-Diaphragm Sensor," Proceedings of the International Conference on Sensors and Actuators-Transducers, '85, pp. 182-185, Philadelphia, Pennsylvania, Jun. 1985.

H. Guckel et al., "Planar Processed, Integrated Displacement Sensors," In *Micromachining and Micropackaging of Transducers*, C. D. Fung et al., Ed., published Jan. 1986, Elsevier Science Publishers, B.V. Amsterdam, Holland, pp. 199-203, Presented orally, Nov. 1984 at Workshop in Micromachining and Micropackaging, Case Western University, Cleveland, Ohio.

H. Guckel et al., "Fine Grained Polysilicon and its Application to Planar Pressure Transducers," paper presented at Transducers '87 Conference, Tokyo, Japan, Jun. 1987.

C. C. G. Visser et al., "A New Silicon Nitride Mask Technology for Synchrotron Radiation X-Ray Lithography: First Results," Microelectric Engineering, presented at the International Conference on Microlithography, Microcircuit Engineering '87, Sep. 22-25, 1987.

H. Guckel et al., "Deposition Techniques and Properties of Strain Compensated LPCVD Silicon Nitride Films," paper presented at 1986 Solid-State Sensors Workshop, Hilton Heat Island, S.C., Jun. 2-5, 1986.

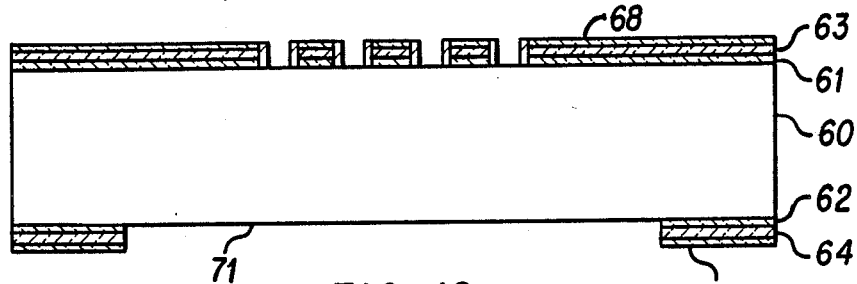
FIG. 19
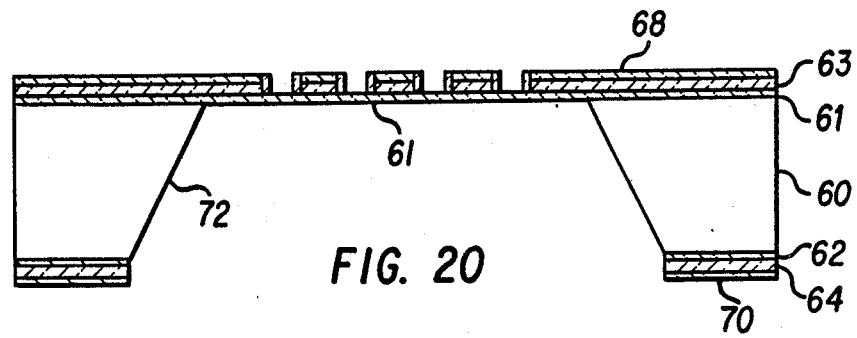
FIG. 20
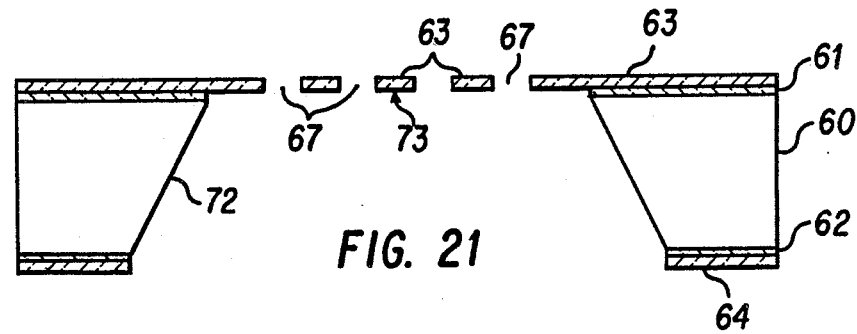
FIG. 21
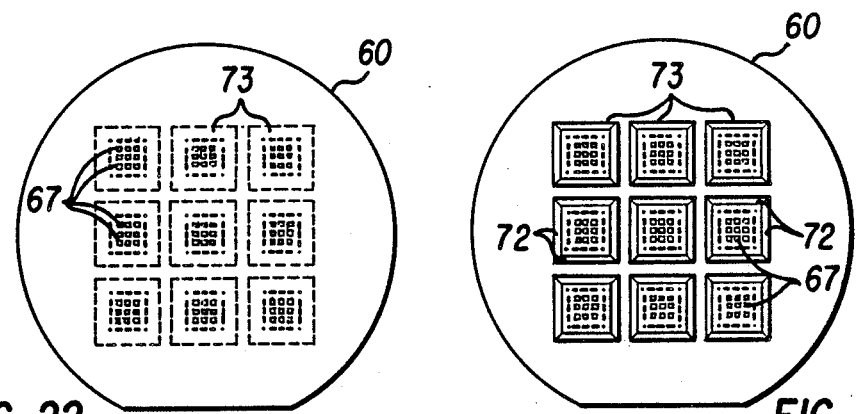
FIG. 22
FIG. 23

POLYSILICON THIN FILM PROCESS

FIELD OF THE INVENTION

This invention pertains generally to the field of semiconductor processing techniques and to structures produced thereby and particularly to the formation of polycrystalline silicon films by chemical vapor deposition.

BACKGROUND OF THE INVENTION

Polycrystalline silicon (polysilicon) films deposited on silicon substrates using low pressure chemical vapor deposition (LPCVD) techniques have electrical and mechanical properties which are attractive both for the formation of microelectronic devices and for the production of certain types of micromechanical devices. For example, LPCVD polysilicon structures may be used in such diverse applications as micromechanical pressure sensors, as described in co-pending U.S. patent application Ser. No. 855,806, X-ray mask blanks, and single crystal on insulator material obtained by recrystallization of polysilicon deposited on the insulator.

LPCVD polysilicon films are typically deposited by pyrolytic decomposition of silane gas at low pressure, although other reaction methods are available. The equation for the chemical reaction is:

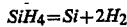

$$SiH_4 = Si + 2H_2$$

This reaction takes place at an elevated temperature in an air-tight furnace, such as a modified oxidation furnace. Typically, the substrate material on which the polysilicon is to be deposited is placed in a cradle in the center of a quartz process tube which can be heated in the furnace. The tube is constructed or fitted with special doors to allow the tube to be evacuated to a moderately low pressure. Silane gas is then introduced at one end of the tube and thermally decomposes on the walls of the tube and the substrate material in the cradle, leaving thin films of polycrystalline silicon on these exposed surfaces. When the desired film thickness is obtained, the silane gas flow is discontinued and various purging cycles are carried out before the substrate materials with the deposited film thereon are removed from the furnace. The four major steps of LPCVD polysilicon depositions are (1) transport of silane, (2) adsorption of silane onto the substrate surface, (3) surface reaction of the silane, and (4) desorption of hydrogen. Silane flow rates are determined by the pumping speed of the pump, the pressure in the process tube, and the volume of the tube. Low pressures are used to enhance the uniformity of the film thickness. At sufficiently high pressures, silane gas can decompose in the gas phase to homogeneously nucleate and grow single crystal grains of polysilicon. At the lower pressures used in the LPCVD process, the silane decomposes catalytically on the substrate surface. Adsorbed silane molecules have some degree of surface mobility before the hydrogen atoms detach from the silicon, and are desorbed, either as atomic or molecular hydrogen, and are pumped away.

The initial silicon atoms also have a certain degree of surface mobility. The adatoms form islands and eventually coalesce to form the lower layer of the film. Additional adatoms therefore deposit on a surface which is chemically different then the initial surface. Surface contamination or poor substrate preparation can lead to local nucleation and growth of grains at sites on the substrate. If the growth is rapid, nodules and protrusions occur in the film, resulting in a haze or a roughness on the film surface, and in more severe cases, resulting in visible defects.

Once nucleation of single crystal silicon grains take place, growth becomes more rapid. Normal film growth in this case will result in columnar type grain structures resulting as the grains grow in the direction of the film, with consequent preferential crystal orientations. Alteration of the deposition conditions can be made to inhibit nucleation and growth, thereby reducing surface roughness, preventing preferential orientations from occurring, and resulting in a film with a lower defect density. Accelerated nucleation and growth due to surface contamination become less severe. One approach to achieving such films is to deposit fine grained, nearly amorphous silicon using lower deposition temperatures for the decomposition of silane. See, T. I. Kamins, et al., "Structure and Stability of Low Pressure Chemically Vapor-Deposited Silicon Films," J. Electrochemical Society: Solid State Science and Technology, June 1978, pp. 927–932; G. Harbeke, et al., "Growth and Physical Properties of LPCVD Polycrystalline Silicon Films," J. Electrochemical Society: Solid State Science and Technology, Vol. 131, No. 3, Mar. 1984, pp. 675–682.

Semiconductor devices typically have a variety of deposited and/or chemically induced thin films, often including films formed by low pressure chemical vapor deposition. These films exhibit strain fields which are sensitive to processing conditions, potentially resulting in internal stresses within the films, under some conditions, of several thousand atmospheres. Consequently, electronic characteristics which depend on life-times, surface states, or bulk and surface mobility are affected by the character of the strain field in the film because each of these quantities is influenced by high stress. If the strains induced in the films are ignored during processing, large or undesirable tolerances result, and in extreme cases, which are typical in very large scale integration (VLSI) device processing, device failure is a consequence. Conversely, if the problem of strain is understood, the resulting strain in the films can be used to improve device performance. For example, mobility increases due to tensile strain can and have been used to improve the performance of N-channel transistors. Thus, if microelectronic devices are to be formed on deposited polysilicon films, the control of the strain fields in the film are crucial to performance of the devices formed on the films.

Similarly, for micromechanical structures using thin polysilicon films, the design of micromechanical components, which typically involves the calculation of beam and plate deflections, requires accurate measurements and control of mechanical quantities such as the built-in strain field in the films, Young's modulus, the Poisson ratio, and the tensile strength of the film. Experience with pressure transducers and fully supported plates as used in X-ray mask blanks, and in the actual processing of various thin films, leads to the conclusion that the dominant mechanical quantity for thin films is the built-in strain field. The tensile strength is also important but secondarily so, and knowledge of Young's modulus and the Poisson ratio are needed if mechanical device performance is to be calculated--for example, for specific device design rather than feasibility studies.

The effect of the built-in strain field on the micromechanical properties of a deposited film are complex but have readily observable and significant consequences in free standing microstructures such as beams and membranes. A doubly supported beam will tend to buckle if it is sufficiently long and if the strain field is large and compressive, whereas a sufficiently short beam in the same compressive field will remain straight. Similarly, a sufficiently large membrane supported at its edges will collapse if it has a sufficiently large built-in compressive strain.

However, doubly supported beams and edge supported membranes can be made much larger if in tensile strain since the built-in strain tends to hold these structures taut. To the extent that such strain fields are inherent in the film produced by a certain process, these strain fields thus impose limits on the dimensions of the micromechancal structures that can be successfully produced. In addition to limiting the potential size of such structures, the strain fields encountered in the films can affect the desired mechanical properties of the structures such as the resonant frequencies of a thin film membrane used as a pressure transducer or microphone.

LPCVD deposited silicon films, both amorphous and polycrystalline, exhibit large compressive strain as deposited. It has been possible to reduce the built-in strain compressive strain, in some cases to very low levels, by annealing. See Harbecke, et al., supra; and R. T. Howe et al., "Stress in Polycrystalline and Amorphous Silicon Thin Films," J. Applied Physics, Vol. 54, No. 8, Aug. 1983, pp. 4674–4675. However, even after annealing such films have heretofore never exhibited tensile strain.

SUMMARY OF THE INVENTION

In accordance with the present invention, uniform fine grained polysilicon is deposited on a substrate by the low pressure chemical vapor deposition process, preferably at a temperature of substantially 580° C. at which the transition from amorphous deposits to fine grained polysilicon deposits occurs. Films grown at this temperature on very clean, defect and contaminant free substrates (e.g., single crystal silicon)exhibit compressive strains after deposit and a very uniform fine crystal grain structure. The strain energy is responsible for recrystallization and grain growth during subsequent annealing. If the film and the substrate are defect free, very rapid recrystallization with average grain sizes less than 300 Angstroms and as low as 100 Angstroms can be achieved after annealing. These grain sizes will not change significantly for doped or undoped samples even after annealing heat treatment at up to 1150° C. for several hours in nitrogen. The morphology of the film, its texture function, becomes essentially process independent. A typical polysilicon film deposited in accordance with the invention on a 3 inch single crystal silicon wafer substrate results in less than 50 defects at 0.5 micron aperture with a surface haze less than 200 Angstroms.

Fine grained polysilicon grown in accordance with the present invention can be appropriately annealed to yield strain fields which are either compressive or tensile. By utilizing proper annealing cycles, it is possible to convert the as-deposited compressive strain in the fine grain polysilicon films to tensile strains of up to 0.3%, with selection of the processing parameters being possible to achieve any desired tensile strain level below 0.3%. Thus, free standing doubly supported beams of substantial length become possible, (e.g., over 1000 microns), in contrast to beams produced in conventional processes which buckle at much shorter lengths because of the compressive strain fields in the beams. In addition, relatively sturdy, very large area fully supported thin diaphragms (e.g., 2 micron thickness) can be produced which are in tensile strain. Diaphragms having 1 centimeter by 1 centimeter lateral dimensions and larger can be formed without failure of the diaphragms or the occurrence of pinholes or cracking in the diaphragm film. Such diaphragms can act as the foundation for an x-ray mask, since the thin polysilicon film is reasonably transparent to x-rays and a material, such as gold, which is a good absorber of x-rays can be laid on the diaphragm in a desired pattern. Further processing steps can be carried out to pattern the diaphragm to form perforations of desired number and shape in the diaphragm. The perforated diaphragm can be coated either with a chemically vapor deposited material to achieve controllable dimensions for the openings in the diaphragm, including suboptical dimensions, or with a vapor deposited heavy material such as gold on only the facing surfaces of the diaphragm to create, for example, X-ray absorption masks which substantially absorb X-rays at all positions on a diaphragm except at the perforations in the diaphragm.

The deposition of polysilicon in accordance with the invention requires that the deposit occur at a temperature not more than about 580° C., and preferably closely maintained to 580° C. during the entire deposition process with very little temperature variation. Cleaning of the substrate prior to deposition and the manner of application of the chemical vapor to produce the polysilicon deposit, are carried out under carefully controlled conditions to avoid any contamination which would result in non-uniform localized nucleation of crystals. Such local nucleation can occur because of defects in the surface, surface contaminants, or disturbances in the deposition process conditions during the critical phase of vapor deposition. If the proper processing steps are followed, polysilicon films having the desired controllable strain properties can be deposited on such varied substrates as single crystal silicon, patterned silicon substrates, silicon nitride layers, and thermally grown silicon oxides. The application of high temperature annealing cycles (e.g., at 1050° C. or higher) results in increasingly lower strain fields as a longer annealing cycle is used, and ultimately produces essentially zero strain in the film. Intermediate annealing temperatures (between about 650°˙C. and 950° C.) result in polycrystalline silicon films having tensile strain whereas annealing at temperatures at or below about 600° C. result in compressive strain which decreases with the length of the annealing cycle. Unannealed films have relatively high compressive strain fields. In contrast, the coarse grained polysilicon formed in accordance with conventional deposition processes, typically carried out around 635° C., give compressive strain fields only, which can be reduced somewhat but usually not to zero upon annealing.

Further objects, features and advantages of the invention will be apparent from the following detailed description when taken in conjunction with the accompanying drawings.

BRIEF DESCRIPTION OF THE DRAWINGS

In the drawings:

FIGS. 13-21 are schematic cross sectional views through a silicon substrate showing the steps in the fabrication of a polysilicon diaphragm in accordance with the invention which has perforations therein.

FIGS. 22-23 are front and back plan views of a silicon wafer having an array of polysilicon diaphragms with perforations formed therein in accordance with the process of FIGS. 13-21.

DESCRIPTION OF THE PREFERRED EMBODIMENTS

Figure 1:
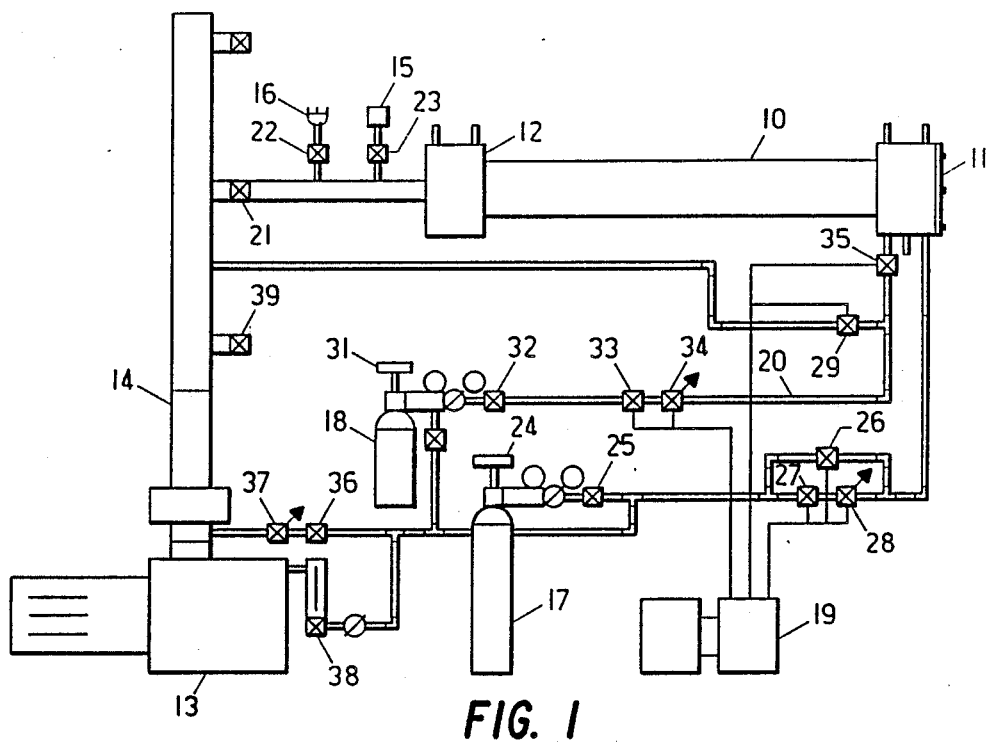
FIG. 1 is a schematic diagram of a low pressure chemical vapor deposition (LPCVD) processing system which may be used in accordance with the present invention.

The present invention allows high quality polysilicon films to be obtained by proper procedures in the preparation of a substrate for deposition, the deposition steps to form a film, and the post-deposition processing of the deposited film. Using such preparation techniques, it has been demonstrated that desired polysilicon films can be deposited on single crystal silicon substrates, patterned silicon substrates, and on thermally grown silicon oxides. In preparation for the processing, the silicon substrate wafers are touched as little as possible on the front side or the side in which the polysilicon is to be deposited. The wafers are carefully cleaned using a process described further below (the "C2" process), including a brisk rinse in ultra clean deionized water prior to polysilicon deposition. The cleaned wafers are blown dry with nitrogen using "Teflon" (trademark) tweezers or vacuum wands on the wafer backside. The deposition steps are carried out immediately after cleaning of the wafers. Polysilicon films can be deposited in this manner on silicon dioxide immediately after oxidation if the C2 cleaning process is carried out on the substrate wafer prior to oxidation, and a sufficiently dry nitrogen anneal is needed to adequately dry wet oxides.

In a typical deposition process in accordance with the invention, the silicon substrate wafers are mounted upright in the processing tube, facing the front or rear. Preferably, a pair of dummy wafers are placed before and after the wafers to be processed, with a 0.15 inch to 0.2 inch spacing between all wafers. The wafers are placed concentric with the tube at a predetermined location in the tube. The tube is immediately pumped down and purged with nitrogen. All gas lines and the tube are purged and checked for leaks because it has been found that excessive leak rates result in poor depositions. Silane gas may be retained in portions of the lines if the silane is at a positive pressure. Silane gas is applied in a controlled manner, with a slow application rate, and is not surged into the processing tube. The operating points are reached in 20 to 30 seconds with preferably little or no overshoot. The silane is steadily applied at a reduced pressure for a period of time (e.g., 1 minute) to allow the initial monolayers of polysilicon to form. The silane flow rate can then be raised steadily, again in 20 to 30 seconds with no overshoot, to increase the deposition rate. Nitrogen gas can also be injected with the silane to throttle the pump and raise the tube pressure if desired. The nitrogen is preferably injected at the pump rather than at the gas inlet side of the tube. The tube pressure and gas flow rates are not allowed to drift or surge. After deposition, silane gas flows are reduced to zero as quickly as possible and nitrogen purging is completed before the wafers are removed. Standby equipment on the LPCVD reactor is normally pumped down with modest nitrogen purging to prevent back streaming. Pre-depositions are performed on the cradle and the processing tube prior to deposition.

Annealing of the wafers with polysilicon film deposited thereon takes place in a second quartz process tube. The wafers are placed in the tube at the deposition temperature (i.e., 580° C.) and are ramped to the desired anneal temperatures. Long, high temperature anneals result in increasingly lower strain fields. Intermediate anneal temperatures result in tensile polysilicon films for the properly formed, fine grained polysilicon films in accordance with the invention. Anneal cycles at temperatures below 600° C. result in compressive strain and no grain size shifts. Fully annealed polysilicon also shows no grain size shifts. Prior to annealing, the deposited films exhibit relatively high compressive strain fields, with the choice of annealing temperatures and cycle lengths determining the final strain in the film, from a relatively large compressive to a relatively large tensile field to a zero strain field. In contrast, coarse grained polysilicon, typically deposited at 635° C., gives compressive strain fields that can be reduced somewhat upon annealing but never to zero strain or to a tensile strain field.

A schematic diagram of an LPCVD system which can be utilized to carry out the process of the present invention is shown in FIG. 1. The LPCVD tube 10 is a standard 110 mm outside diameter by 105 mm inside diameter quartz process tube 70 inches long. The ends require no special treatment. The process tube is installed in a Lindberg Omega 13 stack furnace. The front and rear doors 11 and 12 are made from stainless steel and have a double O-ring seal and aluminum outer nuts. The doors are water cooled. The pump 13 is a Leybold Heraus D60 AC mechanical 2-stage pump, with appropriate traps and nitrogen purge in the return system 14 leading from the process tube and the various supply lines back to the pump. The processing pressure is monitored with a 1000 mTorr Baratron gage 15 and a Hastings thermocouple gage 16.

Nitrogen is available from a nitrogen pressure tank 17 for purging and venting and for throttling the pump. Silane is available from a silane pressure tank 18. The nitrogen and silane flows are controlled with Tylan FC 260 mass flow controllers and a modified Tylan Tymer 16 sequencer 19. The flow controllers are downstream from the shut off valves. The range for the silane mass flow controller is 0 to 100 sccm and the range for the nitrogen flow controller is 0 to 1000 sccm. Control valves 21-39 are connected to the various gas supply lines, pump out lines, and pump return lines to control the various flow conditions. The silane gas line 20 can be evacuated directly to the pump 13. The silane lines are set up to allow slow and controlled application of silane at the beginning of the deposition cycle with no surges and also are set up for fast shut off after deposition.

The sequence of operating steps for carrying out the polysilicon deposition utilizing the system of FIG. 1 is set out below as a preferred operating procedure, although it is apparent that other procedures will be utilized in accordance with the present invention where other types of equipment and system structures are used.

Standby Conditions: Polysilicon system and nitride system tubes are pumped down, cradle is at tube center, system controller is on manual and purge N2 is on, set to 50 sccm on the Tylan Tymer 16. Tube pressure is around 130 mTorr. Programmer is in auto mode, and at step 0. Valves 21, 22, 23, 24, 25, 27, 29, 38 and 39 are therefore open. All other valves are closed. Lindberg Omega furnace set to 580° C. in the process tube.

Stage 0.
  Nitride system (valve 39 closed) must not be in use.
  N2 bottle controller 24 pressure must be greater than 150 psi, reulator 25 is set to 15 psi.
  N2 flow to pump casing (set by valve 28) should be ½ liter/min and regulator is set at 1 psi.
  Check oil recirculator for proper operation.
  Close TC gage valve 22.
  Close gate valve 21 on polysilicon system.
  Close gate valve 39 on nitride system. All gases must be off.
  Set purge N2 (valves 27, 28) to 250 sccm on Tymer 16.
  Switch controller out of "manual".
  All gas switches on controller should be out.
  Depress "start" button.
Stage 1.
  Tube will vent (valve 26 opens) automatically for 0.4 min.
Stage 2.
  Vent N2 (valve 26) turns off, purge N2 (valves 27, 28) comes on, alarm will sound to notify operator that the tube is open.
  Depress "end alarm".
  Remove front door.
  Remove cradle and load wafers into every second slot in front of the reference wafer, about 5 mm. Two dummy wafers are placed in front of and behind the process wafers.
  Restore cradle to tube center, using appropriate mark on pushrod.
  Check O-ring and O-ring surface and replace front door.
  Open gate valve 21 slowly and pump system down.
  Depress "enter step".
Stage 3.
  N2 purge (valves 27, 28 on) for 5 min.
  Tube pressure is about 440 mTorr.
Stage 4.
  N2 purge (valves 27, 28 on) and silane line pumpout (valve 29) on, for 5 min then pause.
  Depress "end alarm".
  Depress "enter step".
Stage 5.
  N2 purge (valve 27) off, silane line pumpout (valve 29) on, pump down to baseline and pause.
  Depress "end alarm".
  Perform leak check; close gate valve 21 and record pressure rise for 1 min.
  Minimum pressure is about 10 mTorr, less than 10 mTorr/min leak.
  Record date, N2 bottle pressure, wafer numbers and position, minimum pressure and leak rate of tube, tube temperature controller settings, wafer identification and run time.
  Open gate valve 21.
  Ensure that the silane regulator valve 32 and N2 purge valve 30 are closed and regulator is backed out.
  Set run time on thumbwheel.
  Double check above 5 steps.
  Open silane bottle valve 31 and regulator valve 32.
  Set regulator to 15 psi.
  Depress "enter step".
Stage 6.
  "Soft start" valve 34 on, silane line pumpout valve 29 open for 0.2 min.
  Silane flow controller valve 34 then closed tightly during "soft start", valves 33 and 35 remain closed.
  Tube pressure must not surge or rise above baseline pressure.
Stage 7.
  Low silane flow (valves 33, 34, 35 on), 3 sccm for 1.7 min. (readout set to 5 sccm). Note correction factor of 0.6 for silane flows.
Stage 8.
  High silane flow (valves 33, 34, 35 on), 48 sccm (readout set to 80 sccm).
  Ensure silane regulator pressure is greater than or equal to 15 psi; increase if flow controller 34 fails to reach desired flow. Add injector nitrogen if desired (valves 36, 37). Operating point is 300 mTorr above baseline pressure.
  Record operating pressure.
  Close Baratron gage valve 23 except when monitoring tube pressure.
  Turn off silane bottle valve 21 before run ends (about 10 min for 600 psi bottle pressure).
  Log silane bottle pressure.
  Set nitrogen anneal tube to desired temperature (580° C.).
Stage 9.
  Silane line pumpout valve 29 open and valves 33 and 35 close, pump down LPCVD tube 10, 5 min.
  Nitrogen injector valve 36 is closed.
Stage 10.
  N2 purge (valves 27, 28 open) and silane line pumped out (valve 29 open), 5 min.
  Close silane regulator valve 32, back out regulator, close bottle valve 31 tightly.

Stage 11.
  Pump down to baseline.
  Depress "end alarm".
  Record postdeposition pressure and tube leak rate by closing gate valve 21.
  Gate valve 21 remains closed.
  Depress "enter step".
Stage 12.
  N2 purge (valves 27, 28 open), 0.1 min and pause.
  Depress "end alarm" and "enter step".
Stage 13.
  Vent system (valve 26 open).
Stage 14.
  Vent N2 (valve 26) is closed, N2 purge (valves 27, 28 open) turns on, and alarm sounds.
  Depress "end alarm".
  Unload wafers.
  Return cradle to tube center.
  Replace door.
  Open gate valve 21 and pump system down.
  Open nitride system gate valve (39).
  Depress "reset".
  Switch controller to "manual".
  Switch on purge N2 (valves 27,28), return to 50 sccm.

The Tymer 16 program steps are:
1. Vent, 0.4 min.
2. N2 purge on, 0.1 min, and pause.
3. N2 purge, 5 min.
4. N2 purge, silane line pumpout, 5 min, pause.
5. Gases off, silane line pumpout on, 0.1 min, pause.
6. Soft start, silane line pumpout, 0.2 min.
7. Low silane, 1.7 min (set TW switch on also).
8. High silane, read from thumbwheel.
9. Silane line pumpout, 0.5 min.
10. N2 purge and silane line pumpout, 5 min.
11. Gases off, silane line pumpout on, 0.1 min, pause.
12. N2 purge, 0.1 min, pause.
13. Vent, 0.4 min.
14. N2 purge, 0.1 min, pause. Program ends here.
15. N2 purge, 5 min, pause.
16. N2 purge, 5 min, pause.
17. N2 purge, 5 min, purge.

Several material processing and equipment related factors have been shown to or are considered to be detrimental to the growth of high quality fine grained polysilicon. These factors are discussed below.

With respect to material related items, the initial residues from packaging or sawing must be carefully cleaned. The starting material must be free of scratches and defects.

With regard to procedures, the wafers must be handled in such a manner that they are not scratched or placed in contact with any unclean surface. Metal tweezers are not allowed and Teflon tweezers must be cleaned. The quartz holders and boats must not scratch the substrates. The cleaning cycles must completely remove any surface contamination. A final etch in diluted hydrofluoric acid (HF) is recommended to yield a reproducible surface. The final rinse in deionized water must be brisk and thorough. The final blow off drying must be complete. If polysilicon is deposited on a thermal oxide, the oxide must be sufficiently annealed in N2 at the oxidation temperature to thoroughly dry the wafers and the oxide. The operating temperature during deposition must remain as close as possible to 580° C. for fine grain growth with sufficiently fast deposition rates. Low operating pressures are desired during deposition for radial uniformity. A soft start is preferred to allow time for the initial film to incubate and coalesce. The tubes and gas lines of the system must be purged or evacuated immediately prior to deposition to keep air and other gases out.

Machine and system related items that must be carefully controlled include any temperature instabilities because fluctuations of even a few degrees can cause poor polysilicon films to be formed. The furnace controllers must be operating correctly to prevent temperature overshoot. Pressure instabilities must be minimized because surges in gas pressure, i.e., with regulator adjustments, will flair the polysilicon. Leaks, especially atmospheric leaks and leaks through the door seals, must not exist. Any oxygen in the gas lines must be eliminated. Oil vapors backstreaming from the pump must be prevented. The system must be free of silicon dioxide or other flake material which can settle on the wafers. The door seals, e.g., 0-rings, must not leak, outgas or deteriorate.

A preferred cleaning cycle, referred to herein as the "C2" cleaning cycle, is preferably used to adequately clean the wafers. The cleaning cycle includes a first bath in sulfuric acid at 160 to 180° C. for 3 minutes, a second bath in sulfuric acid at 160 to 180° C. for 3 minutes, and then a rinse in deionized water for 15 minutes. Thereafter a hydrofluoric acid etch is carried out for 2 minutes with a preferred ratio of 50 parts deionized water to 1 part hydrofluoric acid. This is followed by a rinse in deionized water for 15 minutes. This is followed by a bath in ammonium hydroxide, hydrogen peroxide, and deionized water, 1 part to 1 part to 6 parts, for 10 minutes at 75 to 80° C. This is followed by a rinse in deionized water for 15 minutes and then an etch in hydrofluoric acid for 2 minutes with a ratio of 50 parts deionized water to 1 part hydrofluoric acid. This is followed by a final rinse in deionized water for 30 minutes for polysilicon depositions at fast flow.

The deionized water system preferably consists of a still followed by deionization and ultrafiltration with cut off at 10,000 molecular weight. The system tubing is preferably 100% PFA polytetrafluoroethylene (Teflon). The resulting water resistivity is preferably greater than 18.8 megohms-centimeters.

Figure 36:
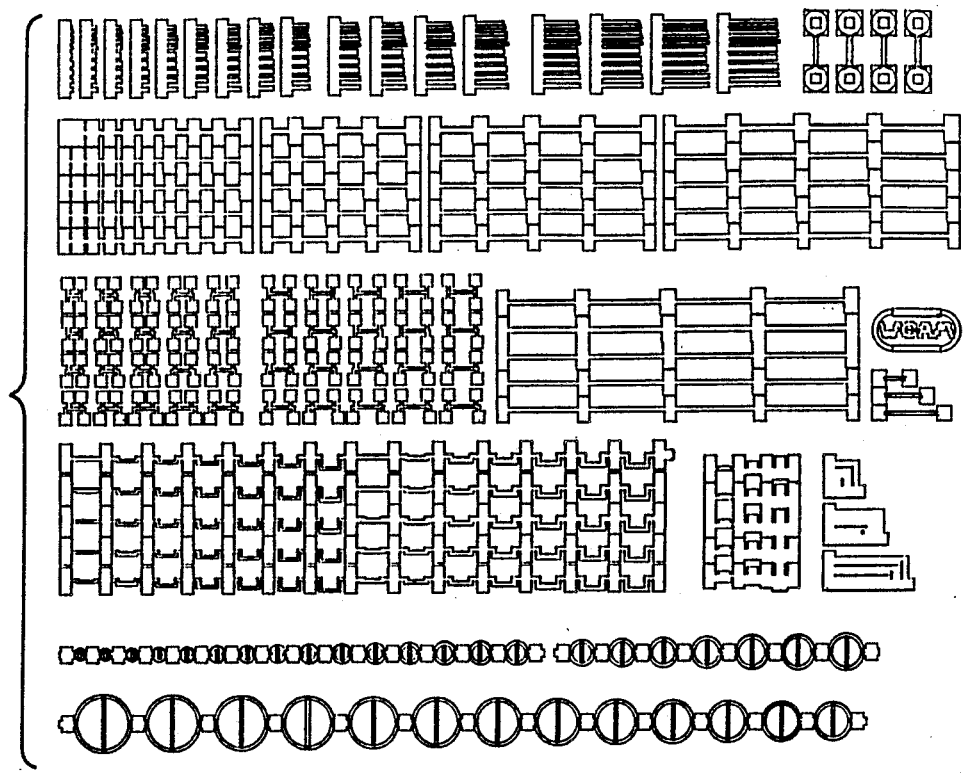
FIG. 36 is a mask for an array of strain measurement structures which may be formed of polysilicon film to determine the strain therein.

The strain existing in the polysilicon film formed in accordance with the processing techniques of the present invention can be measured and its variation with different processing conditions, such as annealing times and temperatures, can be determined. Strain can be measured, for example, by using strain measurement structures formed of the polysilicon deposited onto a silicon wafer such as those shown in FIG. 36. See, e.g., H. Guckel, et al., "Fine Grained Polysilicon and its application to Planar Pressure Transducers," Transducers '87, the 4th International conference of Solid State Sensors and Actuators, Tokyo, Japan, June 1987, pp. 277-281; H. Guckel, et al., "A Simple Technique for the Determination of Mechanical Strain in Thin Films with Applications to Polysilicon," Journal of Applied Physics, Vol. 57, No. 5, 1 Mar. 1985, pp. 1671-1675.

Figure 37:
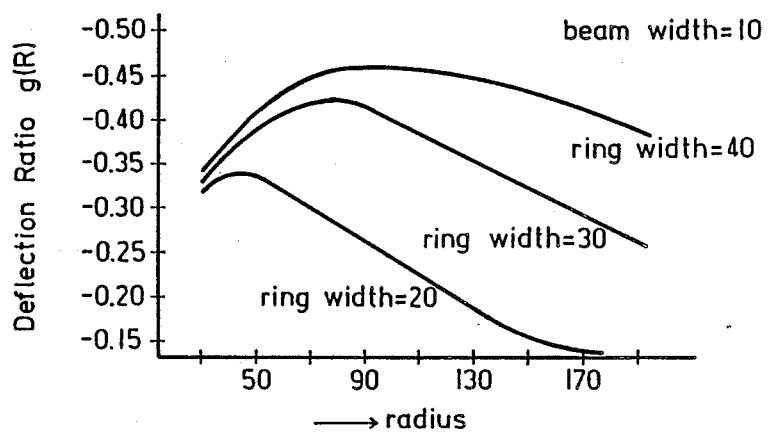
FIG. 37 is a plot of the deflection ratio for various ring thickness used in determining strain with the structures of FIG. 36.

The diagnostic structures of free standing beams are formed on a substrate surface. For a given compressive strain field, beam buckling of free standing beams clamped to the substrate at both ends will occur for all beams longer than a critical length $L_{cr}$. Using the Euler criterim for buckling of beams, the strain field is $$\epsilon = -(\tfrac{1}{3})\,(\pi t/L_{cr})^2$$

where ε is the strain field (negative in the case of compression) and t is the beam thickness. To measure tensile strain fields, a ring structure with a beam across the ring is used, as shown in the bottom two rows of FIG. 36. The width of the beam is kept constant for each of these structures but the radius of the ring, and therefore the length of the beam, is changed. Under tension, the ring will decrease in size, resulting in buckling of the beam, which will occur at a strain field:

$$\epsilon = -(\pi t/R_{cr})^2/12g(R_{cr})$$

with $R_{cr}$ being the critical ring radius of the centroid at buckling and $g(R_{cr})$ is the deflection ratio of two points on the ring 90 apart. The deflection ratio function $g(R_{cr})$ is shown plotted in FIG. 37 for different ring thicknesses. The function $g(R_{cr})$ is negative and thus the tensile field ε is positive. The buckling can easily be seen under a microscope with phase contrast. Using such diagnostic structures, it is possible to determine whether the deposited film is in compression or tension and the magnitude of the strain field, either compressive or tensile, depending on which of the array of diagnostic structures show buckling.

Figure 2:
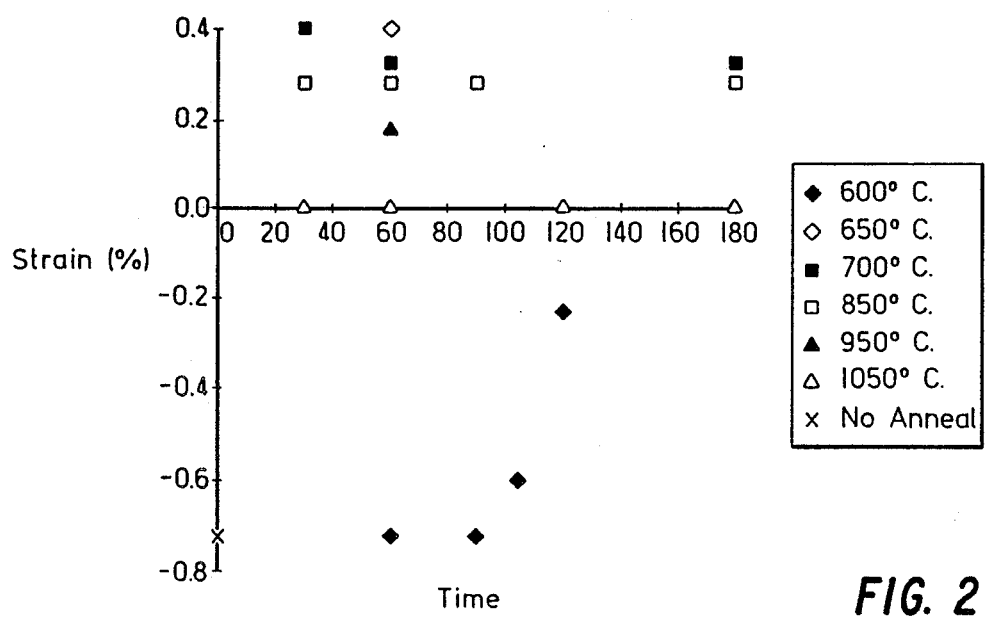
FIG. 2 is a graph indicating the strain in polysilicon films formed in accordance with the present invention after several different annealing cycles.

By way of example of the process of the present invention, several 3 inch single crystal silicon wafers had polysilicon deposited thereon in accordance with the process described above to a depth of approximately 2.02 microns, at a uniformity of plus or minus 0.02 microns over the surface of the wafer. Using an Alpha-Step Profilometer, at 15 micron scan lengths, the roughness TIR was found equal to 20 Angstroms and RA=5. The deposition rates were 50 Angstroms per minute at 580° C., 3 mTorr, 48 sccm Silane, using injected nitrogen, and 45 Angstroms per minute at 580° C., about 100 mTorr, 60 sccm Silane with no injected nitrogen. The wafers with polysilicon deposited thereon in a film patterned to create the diagnostics structures thereon was then subjected to annealing for varying lengths of time in a nitrogen atmosphere without oxygen, from 30 to 180 minutes, at 600° C., 650° C., 700° C., 850° C., 950° C., 1050° C. and 1150° C. The results of the strain measurements for the various wafers at the various anneal temperatures as a function of the time of annealing is shown in FIG. 2. As illustrated therein, with no annealing the strain field is initially compressive and decreases slowly over time at an annealing temperature of 600° C. but remains compressive. At a high temperature annealing of 1050° C. or above, the polysilicon film evidences essentially zero strain after a very short annealing time of 30 minutes and continues to show virtually no strain field when subjected to longer periods of annealing at that temperature. For temperatures intermediate between 600° C. and 1050° C., i.e., from about 650° C. to about 950° C., the strain field is observed to reverse to a tensile strain field which generally decreases toward zero strain as the annealing temperature is increased. Thus, it is seen that a desired strain level, either compressive or tensile, between the maximum and minimum compressive or tensile values, can be chosen and appropriate annealing cycles and temperatures can be found which will yield a film having the desired compressive or tensile strain field, including zero strain field.

Figure 3:
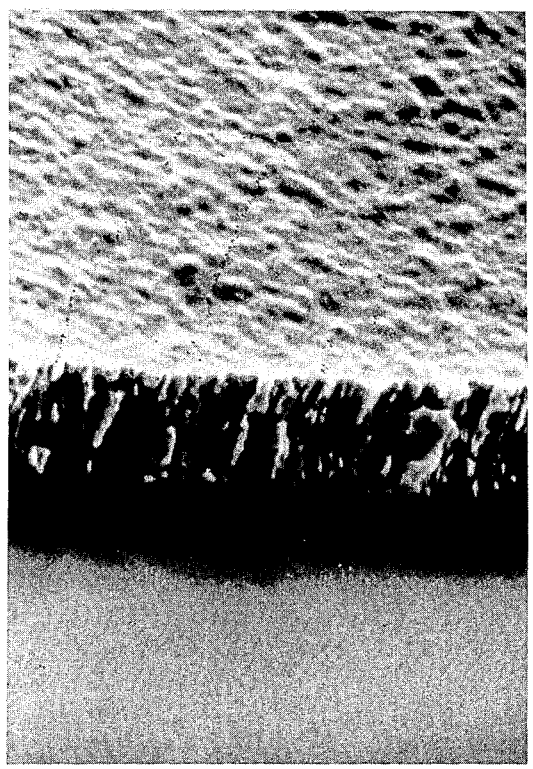
FIG. 3 is a photomicrograph of a conventional LPCVD polysilicon structure having columnar grains.
Figure 4:
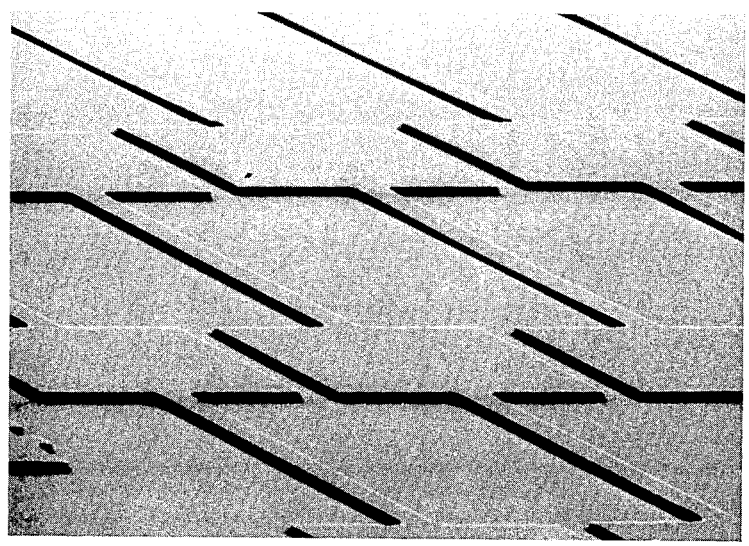
FIG. 4 is a photomicrograph showing polysilicon structures deposited in accordance with the present invention in which virtually no texture is visible in the fine grained polysilicon film.

The contrast between the grain structure of conventional polysilicon and fine grain polysilicon films grown in accordance with the present invention is illustrated in FIG. 3 and 4. FIG. 3 shows the columnar grains in polysilicon deposited at 640° C. This coarse grain polysilicon has a compressive strain field which reduces somewhat upon annealing but can never be reduced to zero even at elevated temperatures. The fine grain polysilicon film structures shown in FIG. 4 were deposited in accordance with the present invention at 580° C. as described above and show virtually no texture. Such material generally has an average grain size less than 300 Angstroms and can be obtained with grain sizes as low as 100 Angstroms. The grain size has not been found to change significantly for doped or undoped samples even after heat treatment at temperatures as high as 1150° C. for several hours in nitrogen.

The following are examples of application structures which can be formed using the present invention.

Figure 5:
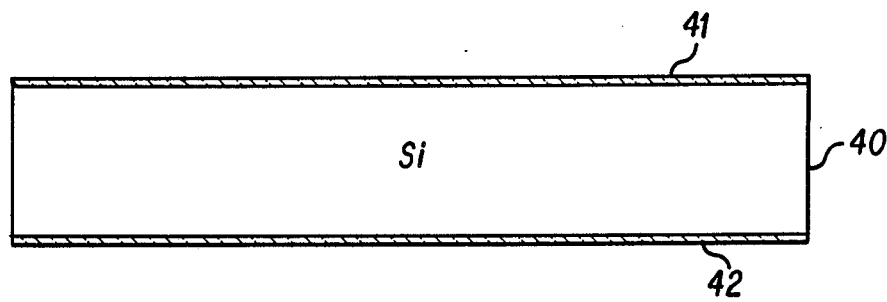
FIGS. 5-10 are schematic cross sectional views through a silicon substrate showing the steps in the fabrication of a polysilicon diaphragm formed in accordance with the present invention.
Figure 6:
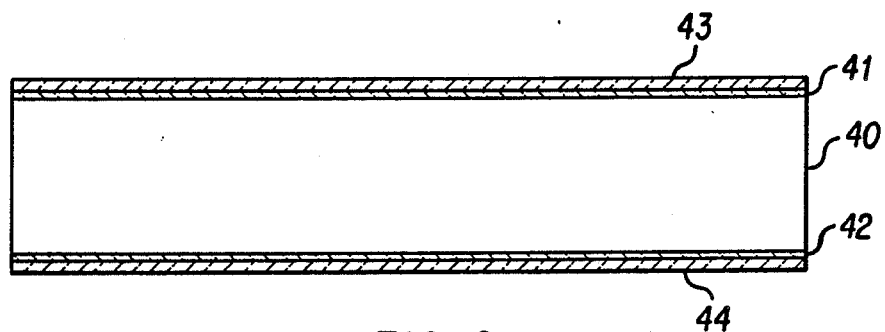
Figure 7:
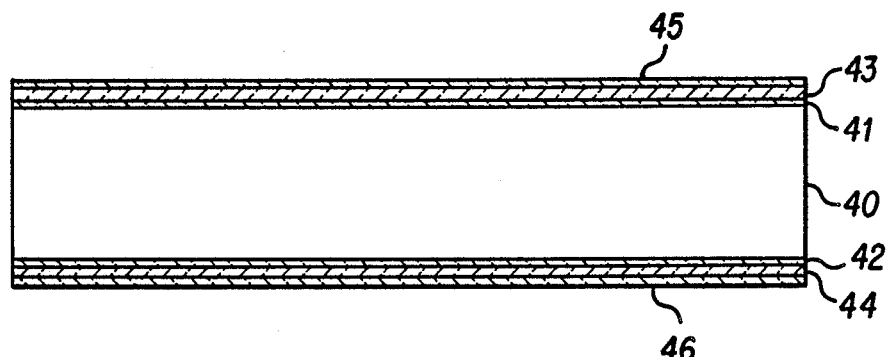
Figure 8:
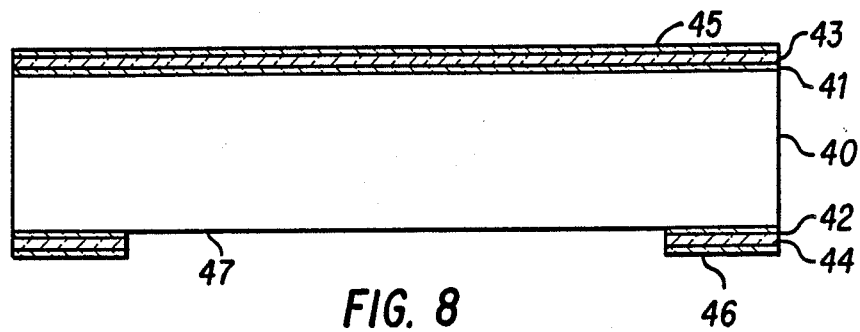
Figure 9:
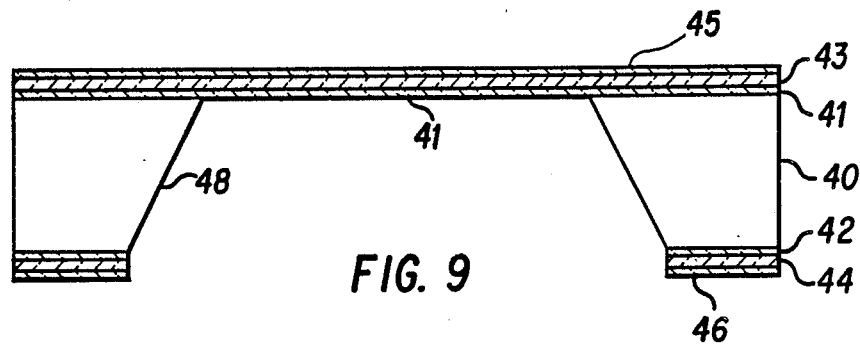
Figure 10:
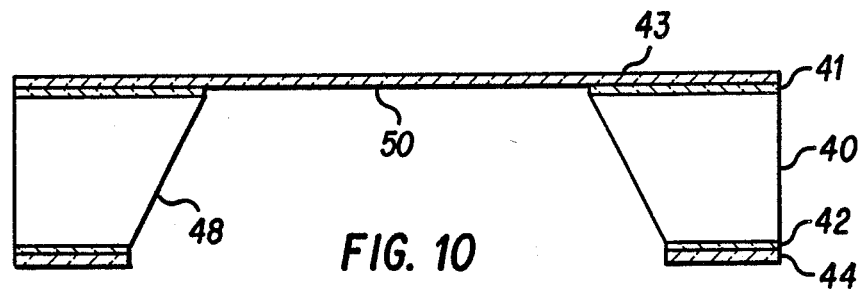
Figure 11:
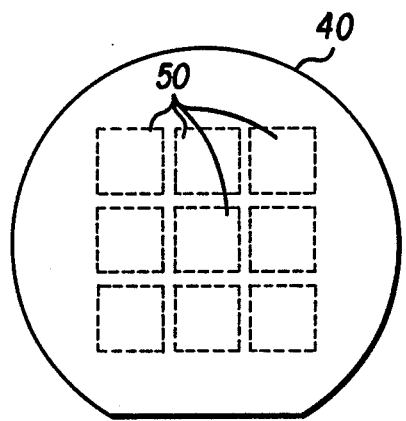
FIGS. 11 and 12 are front and back plan views of a silicon wafer on which an array of polysilicon diaphragms have been formed by the process of FIGS. 5-10.
Figure 12:
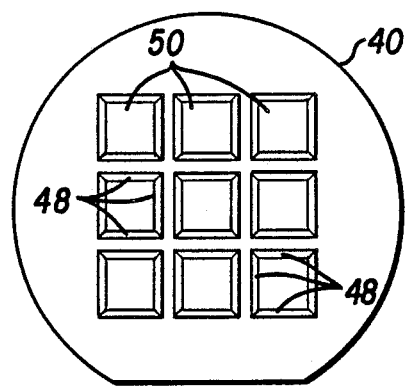

First, a polysilicon diaphragm supported only at its edges, which is useful for various purposes including pressure sensor diaphragms and X-ray mask foundations, is made by the forming sequence illustrated in FIGS. 5–12. An initial substrate wafer of signal crystal (100) silicon 40 was provided and layers of strain compensated silicon nitride 41 and 42 were deposited on both surfaces thereon to a 2,500 Angstrom depth in a conventional manner by LPCVD deposition, as illustrated in FIG. 5. Strain compensation of the silicon nitride layer can be accomplished by choice of the gas ratio during deposition. See, M. Sekinoto, et al., "Silicon Nitride Single-Layer X-ray Mask," Journal of Vacuum Science Technology, Vol. 21, No. 4, Nov./Dec. 1982, pp. 1017–1021. Slightly tensile silicon nitride films are preferred for the present case. The silicon nitride was then covered with films of polysilicon 43 and 44 to 2.0 micron depth, shown in FIG. 6, in accordance with the polysilicon deposition procedures described above wherein the substrate constituted the silicon wafer 40 as a base with the nitride layers 41 and 42 thereon providing the surfaces on which the polysilicon films are deposited. Additional layers of silicon nitride 45 and 46 were then LPCVD deposited over the polysilicon layers to a depth of 2500 Angstroms and an anneal cycle was performed as described above to place the polysilicon film in a low tensile strain field, as shown in FIG. 7. The back side of the wafer 40 was then patterned to open up a square area 47 slightly greater than 1 centimeter by 1 centimeter by removing the nitride layers 42 and 46 and the polysilicon layer 44 in the square area with appropriate etchants (HF for the silicon nitride and CF$_4$ plasma etch for the silicon nitride and polysilicon), as illustrated in FIG. 8. The patterned wafer was then subjected to an anisotropic etch to etch the substrate single crystal silicon 40, using ethylene diamine pyrocatechol (EDP), with the etch stopping at the silicon nitride layer 41, leaving sloping walls 48 defining the boundaries of a cavity which bottoms out on the layer 41, as illustrated in FIG. 9. The wafer wa then submersed in concentrated HF to remove the exposed silicon nitride, leaving the polysilicon layer 43 exposed and defining a diaphragm 50 in the polysilicon film, shown in FIG. 10. As an example, FIG. 11 shows the front side of the wafer 40 having a 3 by 3 array of 1 centimeter by 1 centimeter diaphragms 50 (2 micross thick) formed thereon and FIG. 12 shows the back side of the wafer with the diaphragms 50 and the sloping slide walls 48 which form the cavities defining the diaphragm. The diaphragms 50 are useful for such purposes as pressure sensor diaphragms and also as X-ray blanks. A 2 micron thick diaphragm of polysilicon shows approximately 66% transmission for synchrotron x-ray radiation and exhibits good thermal stability. The diaphragms can also be used to form microphones by, for example, forming a full bridge of piezo-resistive polysilicon resistors on an insulating silicon nitride layer formed over the polysilicon diaphragm.

Figure 13:
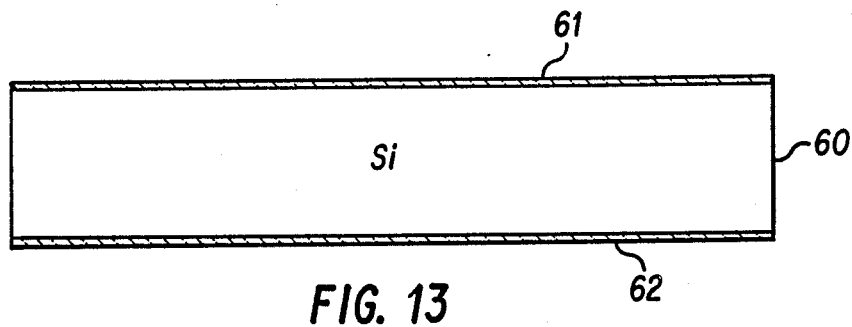
Figure 14:
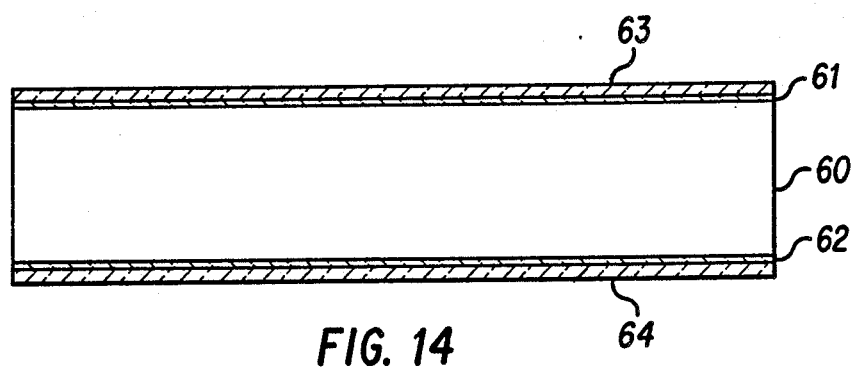
Figure 15:
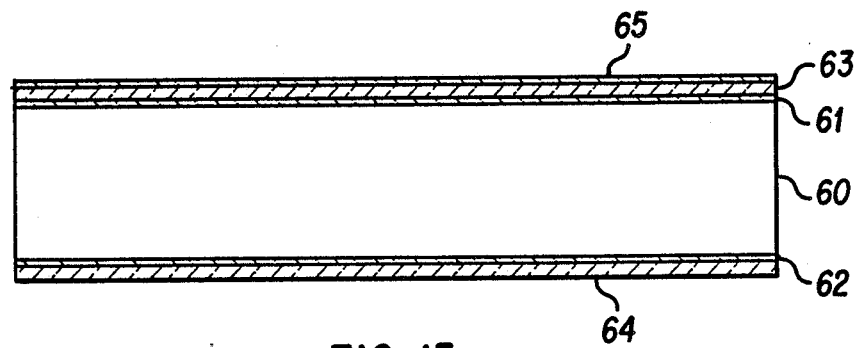
Figure 16:
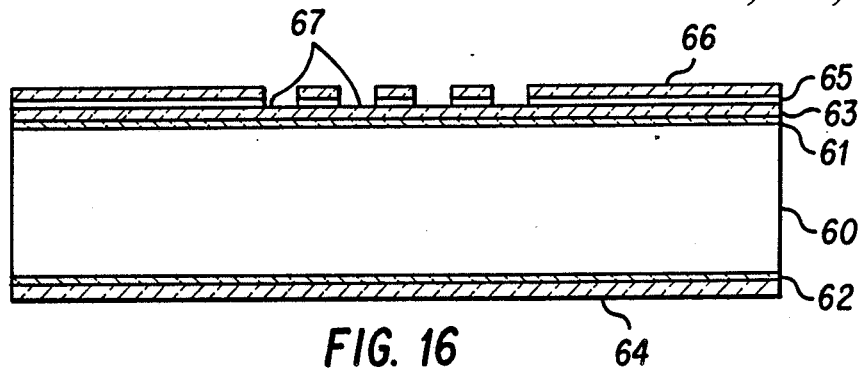
Figure 17:
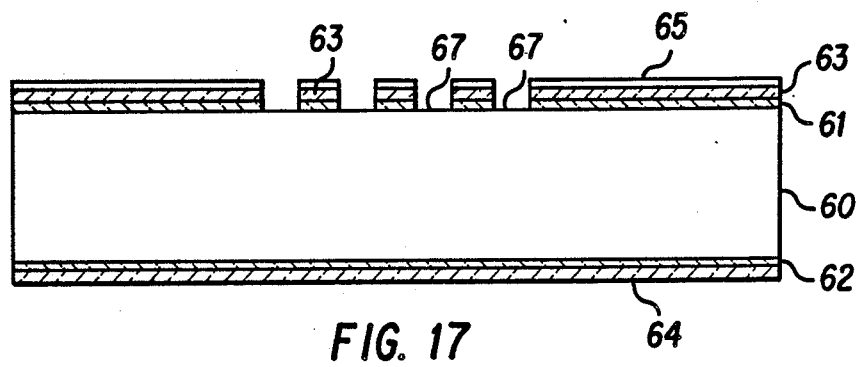
Figure 18:
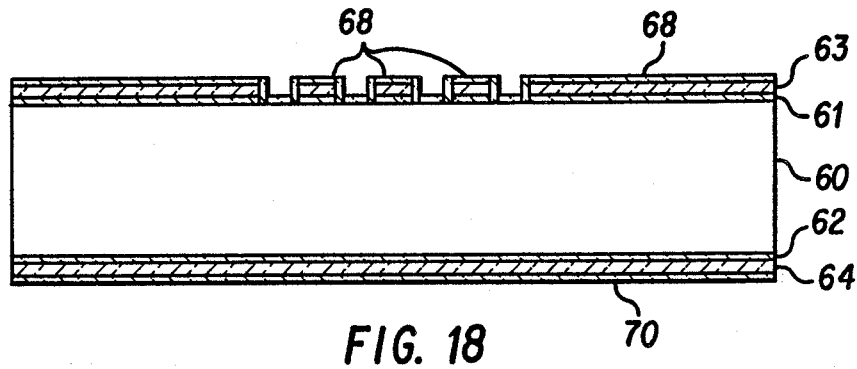
Figure 24:
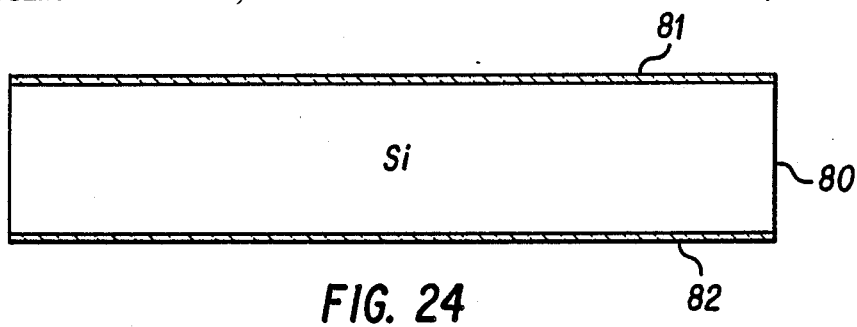
FIGS. 24-33 are schematic cross sectional views through a silicon substrate showing the steps in the fabrication of perforated polysilicon diaphragms thereon and the back filling of the perforations to controlled dimensions.
Figure 25:
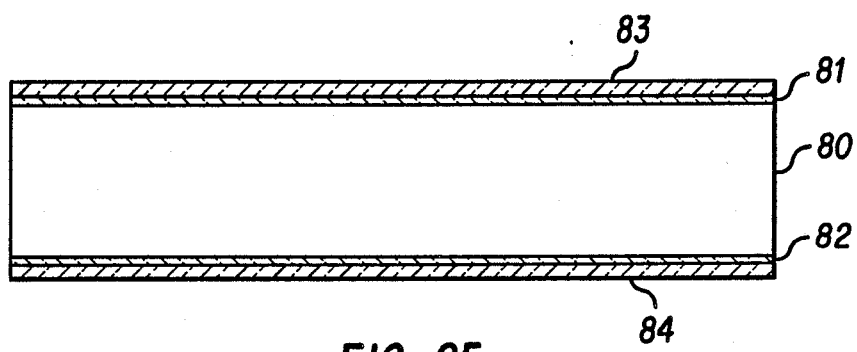
Figure 26:
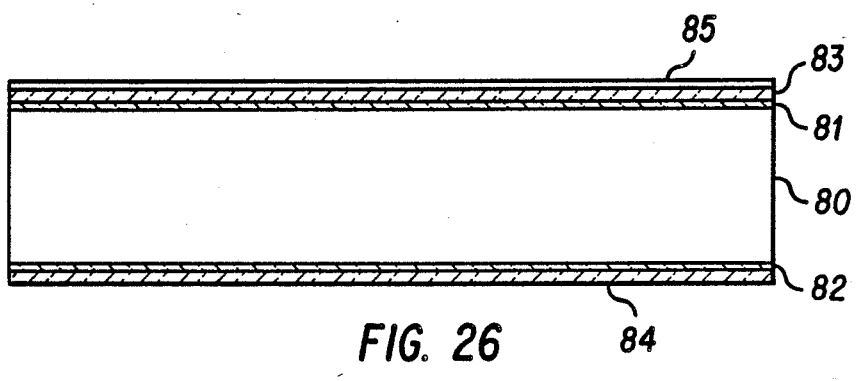

Perforated polysilicon diaphragm or plates can be formed utilizing similar processing steps, as illustrated in the views of FIGS. 13–23. As shown in FIG. 13, a wafer 60 of single crystal silicon has initial layers 61 and 62 of silicon nitride deposited thereon to 2500 Angstroms in depth to form the substrate, and polysilicon layers 63 and 64 are then formed over the nitride layers to a depth of 2 microns utilizing the processing steps of the invention described above, as illustrated in FIG. 14. As shown in FIG. 15, a layer of chromium 65 is deposited to a depth of 1200 Angstroms, using an E beam evaporator (a sputtering system can also be used), over the polysilicon 63 on the front side of the substrate. As shown in FIG. 16, a photo-resist layer 66 is then applied over the chromium layer 65 in a pattern and an etchant is applied to the chromium to leave openings 67 in the chromium. After removal of the photo resist, as shown in FIG. 17, the polysilicon is etched by applying a vertical wall polysilicon etch to leave the holes 67 between connecting portions of the polysilicon layer 63. As shown in FIG. 18, the chromium is then stripped and a layer of silicon nitride 2500 Angstroms in depth is LPCVD deposited over the polysilicon, and an annealing cycle is then applied as above to provide the polysilicon film with a small tensile strain field.

As shown in FIG. 19, the back side of the wafer is then patterned as described above to leave an open area 71, as shown in FIG. 20, and an anistropic etchant (EDP) is applied to etch the single crystal silicon substrate 60 to form a cavity which stops at the silicon nitride layer 61, leaving sloping cavity sidewalls 72. The silicon nitride was then removed, as shown in FIG. 21, utilizing a silicon nitride etchant (concentrated HF) to leave the film 63 of polysilicon on the top surface of the wafer and defining a square diaphragm 73. Diaphragms were formed in this manner approximately 1 centimeter on a side with openings 67 therein approximately 4 microns in diameter and with approximately 3 million of these openings 67 per square centimeter. FIG. 22 shows the front side of the wafer with a 3 by 3 array of diaphragms 73 with the openings 67 shown greatly exaggerated in size, and FIG. 23 shows the back side of the wafer 60 with the diaphragms 73 formed therein, illustrating the sloping sidewalls 72 of the cavities which define the diaphragms. Although not shown, the exposed surface of the polysilicon layer 63 can have a metal layer evaporated thereon, e.g., chromium or gold, which will deposit by evaporation only on the exposed facing surfaces and not on the surfaces of the openings 67 in the diaphragms. Such materials as gold and chromium will substantially absorb X-rays and thus will allow X-rays to pass through the coated polysilicon diaphragm only at the areas of the holes 67, where the X-rays will be essentially unimpeded. Of course, the holes 67 can have more complicated peripheral geometries, allowing a desired X-ray mask pattern to be formed by the openings in the diaphragm.

The high density of well defined openings in the polysilicon diaphragms described above also allows such diaphragms to be utilized for filtration purposes since the hole sizes in the polysilicon are very sharply defined, providing closely controlled filter pore sizes.

Figure 27:
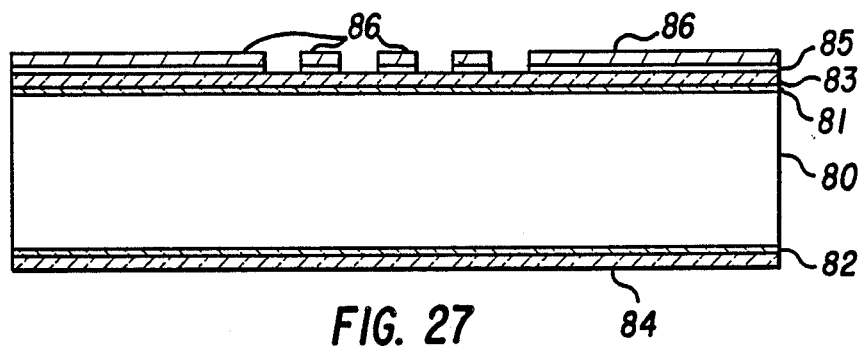
Figure 28:
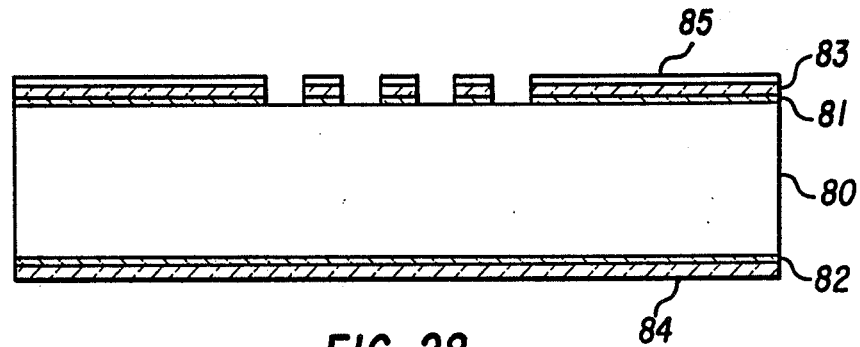
Figure 29:
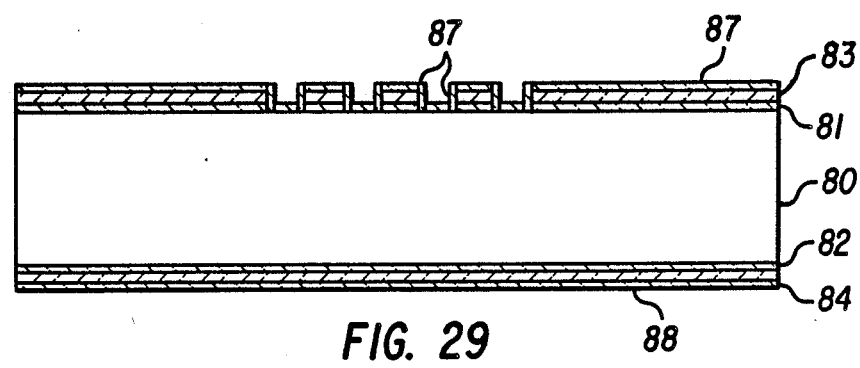
Figure 30:
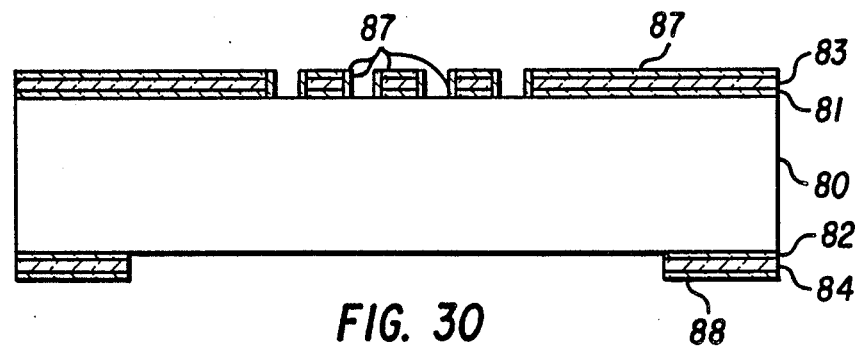
Figure 31:
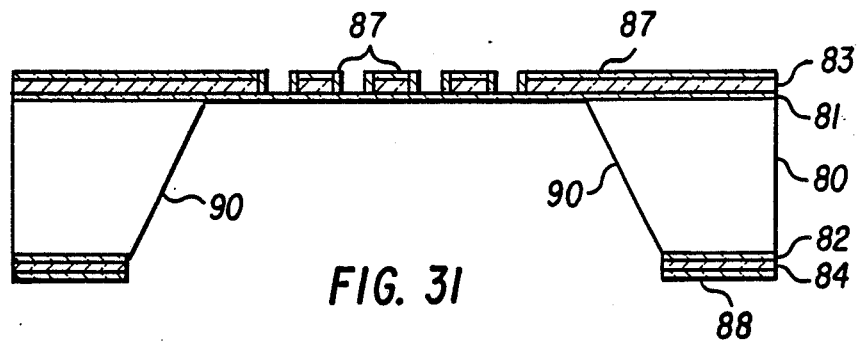
Figure 32:
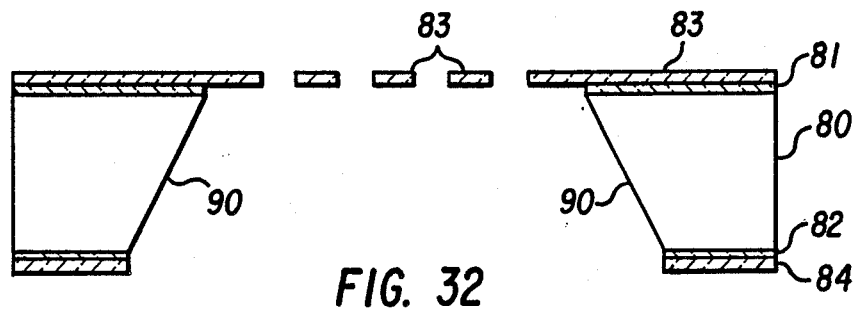
Figure 33:
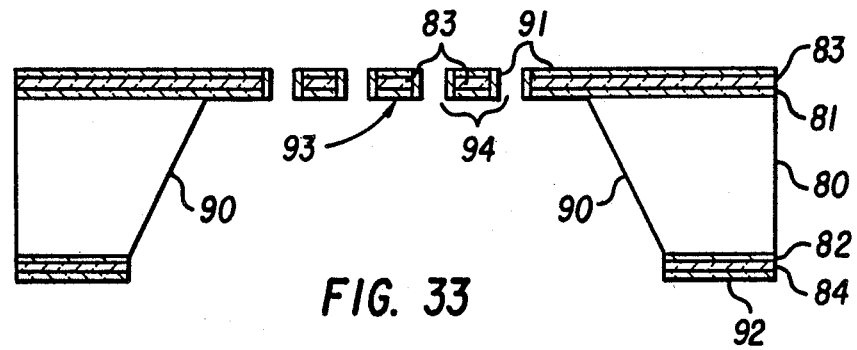
Figure 34:
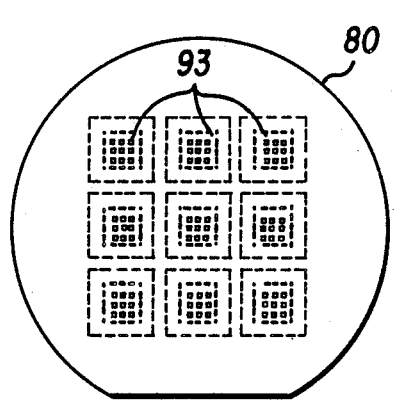
FIGS. 34 and 35 are front and back plan views of a silicon wafer having an array of polysilicon diaphragms having back filled perforations formed in accordance with the process illustrated in FIGS. 24-33.
Figure 35:
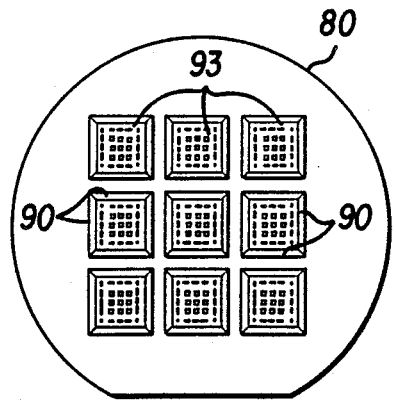

A further extension of the diaphragm forming technique to define polysilicon plates having perforations therein of sub-optical sizes is illustrated in the views of FIGS. 24–35. Many of the processing techniques are essentially identical to those described above. The initial substrate base wafer 80 of single crystal silicon has layers of silicon nitride 81 and 82 deposited thereon (FIG. 24), followed by a deposit of polysilicon films 83 and 84 (FIG. 25) in accordance with the present invention. A layer of chromium 85 is deposited over one polysilicon layer 83 (FIG. 26) and a photo-resist is then applied in a pattern 86 and an etchant is used to remove the chromium layer in the areas exposed by the photo resist pattern (FIG. 27). A vertical wall polysilicon etch is then used to remove the polysilicon in the exposed areas as shown in FIG. 28, and the chromium is then stripped and a layer of silicon nitride 87 is applied over all of the exposed polysilicon layer 83, and a layer of silicon nitride 88 is also formed on the backside of the wafer (FIG. 29). The wafer backside is then etched to define an open area 89 (FIG. 30) and an anisotropic etchant is applied which terminates on the silicon nitride layer 81 to leave a cavity having sloping side walls 90, as shown in FIG. 31. The silicon nitride layers are then remove as shown in FIG. 32, to leave the polysilicon film 83 exposed, and then a layer of silicon nitride 91 and 92 is deposited on all of the exposed surfaces, leaving a diaphragm 93 over the cavity which is composed of an inner film 83 of polysilicon covered by the outer layer 91 of silicon nitride. Because the silicon nitride, applied from a low pressure chemical vapor deposition, can be selected to have any depth desired, the width of the openings 94 can be adjusted to any desired dimensions, including suboptical dimensions which are significantly smaller than the dimensions that can be formed using optical methods to define the resist pattern. A front view of a 3 by 3 array of the diaphragms 93 formed on the wafer 80 is shown in FIG. 34, and a back view of the wafer is shown in FIG. 35, illustrating the diaphragms 93 and sidewalls 90 which define the cavities underlying the diaphragms.

It is understood that the invention is not confined to the particular processes and structures set forth herein as illustrative, but embraces all such modified forms thereof as come with the scope of the following claims.

What is claimed is:

1. A method of forming a polysilicon film having selected mechanical properties, comprising the steps of:
   (a) providing a substrate having a surface on which polysilicon can be deposited;
   (b) preparing the substrate surface so that it is essentially free of defects and contaminants upon which nucleation of polysilicon crystal grains can occur;
   (c) depositing silicon in a film onto the surface of the substrate by decomposition of silane at substantially 580° C. or less under conditions such that the film deposited has substantially uniform fine grain size; and
   (d) annealing the deposited film at a temperature between about 650° C. and 950° C. and for a selected time such that the polysilicon film is in tensile strain after annealing;
wherein the crystal grains of the polysilicon have an average size less than about 300 Angstroms after annealing.

2. The method of claim 1 wherein the step of depositing is performed under conditions such that the average grain size is about 100 Angstroms after annealing.

3. The method of claim 1 wherein the substrate includes single crystal silicon.

4. The method of claim 3 wherein the substrate additionally includes a layer of silicon nitride formed on the single crystal silicon and wherein the step of depositing is performed to deposit the silicon in a film on the exposed surface of the silicon nitride layer.

5. The method of claim 1 wherein the step of annealing is performed at a temperature between about 700° C. and 850° C. for at least 30 minutes so that the polysilicon film is in tensile strain after annealing.

6. A method of making strain controlled polysilicon film comprising the steps of:
   (a) providing a substrate having an unannealed film of amorphous or polycrystalline silicon formed thereon, the film having a structure such that when the film is annealed the average grain size of the crystals will be no larger than about 300 Angstroms; and
   (b) annealing the film by heating the film and substrate at a temperature between about 650° C. and 950° C. for a time selected to yield a desired tensile strain level in the film.

7. The method of claim 6 wherein the step of annealing the film by heating is carried out by raising the temperature of the substrate and film from about 580° C. to the desired annealing temperature at a steady rate over a selected period of time and then maintaining the substrate and film at the desired annealing temperature over an annealing time of at least 30 minutes.

8. The method of claim 6 wherein the step of annealing the film by heating is carried out by heating the film in an atmosphere consisting essentially of nitrogen.

9. A method of forming a thin polysilicon diaphragm comprising the steps of:
   (a) depositing silicon nitride in a layer on a front surface of a base of single crystal silicon having front and back parallel surfaces;
   (b) depositing silicon in a film onto the surface of the silicon nitride layer by decomposition of silane at substantially 580° C. or less under conditions such that the film deposited has substantially uniform fine structure;
   (c) depositing another layer of silicon nitride over the silicon film deposited on the front surface of the substrate;
   (d) annealing the substrate and the films deposited thereon at a temperature between about 650° C. and 950° C. and for a time such that the strain in the deposited polysilicon film is at a selected tensile strain;
   (e) exposing the single crystal silicon of the substrate on the back surface of the substrate in an area underlying the polysilicon film which will be the desired area of the diaphragm;
   (f) anisotropically etching the exposed area of the back surface of the substrate and terminating the etch on the silicon nitride layer deposited on the front surface of the substrate to provide a free diaphragm which includes the polysilicon film.

10. The method of claim 9 including the additional step of removing the exposed silicon nitride layers from the polysilicon film to leave the polysilicon film as the diaphragm.

11. The method of claim 9 wherein the step of depositing the silicon is performed under conditions such that the crystal grains of the polysilicon have an average size less than about 300 Angstroms after annealing.

12. The method of claim 11 wherein the step of depositing silicon in a film is carried out under conditions such that the average size of the polysilicon crystal grains is about 100 Angstroms after annealing.

13. A method of making strain controlled polysilicon film diaphragms or beams comprising the steps of:
   (a) providing a substrate having an unannealed film of amorphous or polycrystalline silicon formed thereon, the film having a structure such that when the film is annealed the average grain size of the crystals will be no longer than about 300 Angstroms;
   (b) annealing the film by heating the film and substrate at a temperature between about 650° C. and 950° C. for a time selected to yield a desired tensile strain level in the film; and
   (c) etching away the substrate under a portion of the annealed film so that that portion forms a free film which is in tensile strain and is supported at its edges by the substrate.

14. The method of claim 13 wherein the step of annealing the film by heating is carried out by raising the temperature of the substrate and film from about 580° C. to the desired annealing temperature at a steady rate over a selected period of time and then maintaining the substrate and film at the desired annealing temperature over an annealing time of at least 30 minutes.

15. The method of claim 13 wherein the step of annealing the film by heating is carried out by heating the film in an atmosphere consisting essentially of nitrogen.

16. The method of claim 1 including the additional step of etching away the substrate under a portion of the annealed film so that that portion forms a free film which is in tensile strain and which is supported at its edges by the substrate.

* * * * *

UNITED STATES PATENT AND TRADEMARK OFFICE
CERTIFICATE OF CORRECTION

PATENT NO. : 4,897,360

DATED : January 30, 1990

INVENTOR(S) : Henry Guckel; David W. Burns

It is certified that error appears in the above-identified patent and that said Letters Patent is hereby corrected as shown below:

Column 9, line 43, after "5 min," delete "purge" and insert --pause--.

Column 12, line 54, "wa" should be --was--.

Column 12, line 60, "micross" should be --microns--.

Column 16, line 26, "longer" should be --larger--.

Signed and Sealed this

Twenty-ninth Day of June, 1993

*Attest:*

MICHAEL K. KIRK

*Attesting Officer*  Acting Commissioner of Patents and Trademarks